(12) United States Patent
Tikhonov

(10) Patent No.: US 11,764,503 B2
(45) Date of Patent: Sep. 19, 2023

(54) PCB EXTERNAL DEVICE CONNECTOR

(71) Applicant: Victor Tikhonov, Clackamas, OR (US)

(72) Inventor: Victor Tikhonov, Clackamas, OR (US)

( * ) Notice: Subject to any disclaimer, the term of this patent is extended or adjusted under 35 U.S.C. 154(b) by 0 days.

(21) Appl. No.: 17/477,484

(22) Filed: Sep. 16, 2021

(65) Prior Publication Data

US 2022/0094090 A1 Mar. 24, 2022

Related U.S. Application Data

(60) Provisional application No. 63/082,372, filed on Sep. 23, 2020.

(51) Int. Cl.
| | |
|---|---|
| *H01R 12/70* | (2011.01) |
| *H01R 12/71* | (2011.01) |
| *H05K 1/02* | (2006.01) |
| *H01R 12/72* | (2011.01) |

(52) U.S. Cl.
CPC ......... *H01R 12/718* (2013.01); *H01R 12/728* (2013.01); *H05K 1/0213* (2013.01)

(58) Field of Classification Search
CPC .................................................... H05K 1/0213
See application file for complete search history.

(56) References Cited

U.S. PATENT DOCUMENTS

| | | | | |
|---|---|---|---|---|
| 4,790,894 A | * | 12/1988 | Homma ............... | H05K 3/3442 29/423 |
| 4,931,021 A | * | 6/1990 | Mohan ................. | H01R 13/28 439/284 |
| 5,300,911 A | * | 4/1994 | Walters ............... | H01F 17/0033 336/200 |
| 6,534,726 B1 | * | 3/2003 | Okada ................. | H05K 3/3442 174/266 |
| 6,727,116 B2 | * | 4/2004 | Poo ...................... | H01L 25/105 438/678 |
| 7,155,815 B2 | * | 1/2007 | Gernhardt ........... | H05K 3/3442 361/752 |
| 7,285,850 B2 | * | 10/2007 | Poo ..................... | H01L 23/49838 257/668 |
| 7,482,800 B2 | * | 1/2009 | Ooyabu ................ | H05K 3/363 324/756.07 |
| 7,802,994 B1 | * | 9/2010 | Chen .................... | H01R 12/724 439/682 |
| 9,095,069 B2 | * | 7/2015 | Stefanoff ............. | H05K 1/142 |
| 9,370,101 B2 | * | 6/2016 | Ishihara ............... | H05K 1/142 |

(Continued)

*Primary Examiner* — Harshad C Patel
(74) *Attorney, Agent, or Firm* — Mark S Hubert

(57) ABSTRACT

A two part connector for the temporary connection of an external periphery device to a printed circuit board (PCB). When coding or diagnostics need to be performed on much of todays electronic or electronic controlled equipment, an external unit needs to be physically connected to the microprocessor on the PCB of the equipment. Until now equipment manufacturers either install a socket onto the PCB, or form a mating part of connector directly on the surface of PCB, that is electronically connected to the microprocessor through electrical trace paths. This device eliminates the need for a socket and forms an intermediary element between the external unit and the PCB, that connects to the PCB with a set of vertical pins that matingly connect to a series of cutouts on the PCB. This device connects to a plethora of external devices and takes zero space on the surface of the PCB.

2 Claims, 7 Drawing Sheets

(56) References Cited

U.S. PATENT DOCUMENTS

| | | | | |
|---|---|---|---|---|
| 9,590,344 | B2* | 3/2017 | Krishnamoorthy | H01R 13/20 |
| 9,780,471 | B2* | 10/2017 | Van Rijswijk | H05K 3/366 |
| 10,681,809 | B2* | 6/2020 | Lee | H05K 1/182 |
| 11,283,206 | B2* | 3/2022 | Zhou | H01R 12/716 |
| 2002/0080590 | A1* | 6/2002 | Bauermeister | H05K 1/142 |
| | | | | 361/803 |
| 2003/0098178 | A1* | 5/2003 | Shibuya | H01L 23/49805 |
| | | | | 257/E23.061 |
| 2003/0151485 | A1* | 8/2003 | Lewis | H01L 23/645 |
| | | | | 336/200 |
| 2004/0214466 | A1* | 10/2004 | Lin | H01R 12/721 |
| | | | | 439/325 |
| 2013/0078825 | A1* | 3/2013 | Wain | H05K 3/366 |
| | | | | 29/830 |
| 2013/0234909 | A1* | 9/2013 | Koh | H01Q 9/42 |
| | | | | 343/860 |

* cited by examiner

PCB EXTERNAL DEVICE CONNECTOR

CROSS-REFERENCE TO RELATED APPLICATIONS

This application claims the benefit of U.S. Provisional Patent Application No. 63/082,372 filed Sep. 23, 2020, which is incorporated by reference herein in its entirety.

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to printed circuit boards, (PCB) and more particularly to the technology relating to the method of temporary connection of external periphery devices to such PCBs.

BACKGROUND

Printed Circuit Boards (PCB) are typically fiberglass, phenolic, PTFE or any other non-conductive substrate sheets that mechanically support and electrically connect electrical or electronic components using conductive copper tracks laminated or etched onto layers and/or between the substrate sheets. Components such as microprocessors/microcontrollers are generally soldered onto the PCB to both electrically and mechanically attach and connect them to the PCB.

Once the PCB is fabricated, the components thereon may undergo various diagnostics, programming, troubleshooting, circuitry tests and the like performed by external devices such as oscilloscopes, multimeters, ICSP flash programmers, JTAG scanners, and a plethora of others. These typically require at least a pair of mating connectors, one of which is permanently attached to the PCB, the other which is attachable or mated to the external device. The non-removable connector on the PCB, generally is relatively expensive and takes up considerable space. These large connectors go against the purpose of miniaturization of the PCB. Simply stated, these connectors occupy expensive realty on the PCB.

Henceforth, a more compact PCB external device connector that is inexpensive, rugged, easy to connect/disconnect, easy to manufacture and to incorporate onto a PCB, would fulfill a long felt need in the electronics industry. This new invention utilizes and new technologies in a unique and novel configuration to overcome the aforementioned problems and accomplish this.

BRIEF SUMMARY

In accordance with various embodiments, a two part PCB external device connector for removably connecting an external electronic device or an adapter for an external electronic device, to a PCB is provided.

In one aspect, a rugged PCB external device connector that occupies no space on the target PCB when disconnected, is provided.

In another aspect, a PCB external device connector that connects along the corner edges of a PCB or along a linear edge of a connector slot formed into a PCB, or along a section or an arc edge or a round or oval PCB, is provided.

In yet another aspect, a two part PCB external device connector that can be configured in various different geometrical configurations for mating physical and electrical engagement with a PCB of virtually any shape, is provided.

In a final aspect, a two part PCB external device connector that gives an audible and physical indication of a solid electronic connection to the target PCB, and that occupies the smallest amount of space on the target PCB.

Various modifications and additions such as the number of pins or type of integrated connection for periphery devices, can be made to the embodiments discussed without departing from the scope of the invention. For example, while the embodiments described above refer to particular features, the scope of this invention also includes embodiments having different combination of features and embodiments that do not include all of the above described features.

BRIEF DESCRIPTION OF THE DRAWINGS

A further understanding of the nature and advantages of particular embodiments may be realized by reference to the remaining portions of the specification and the drawings, in which like reference numerals are used to refer to similar components.

DETAILED DESCRIPTION OF CERTAIN EMBODIMENTS

Figure 1:
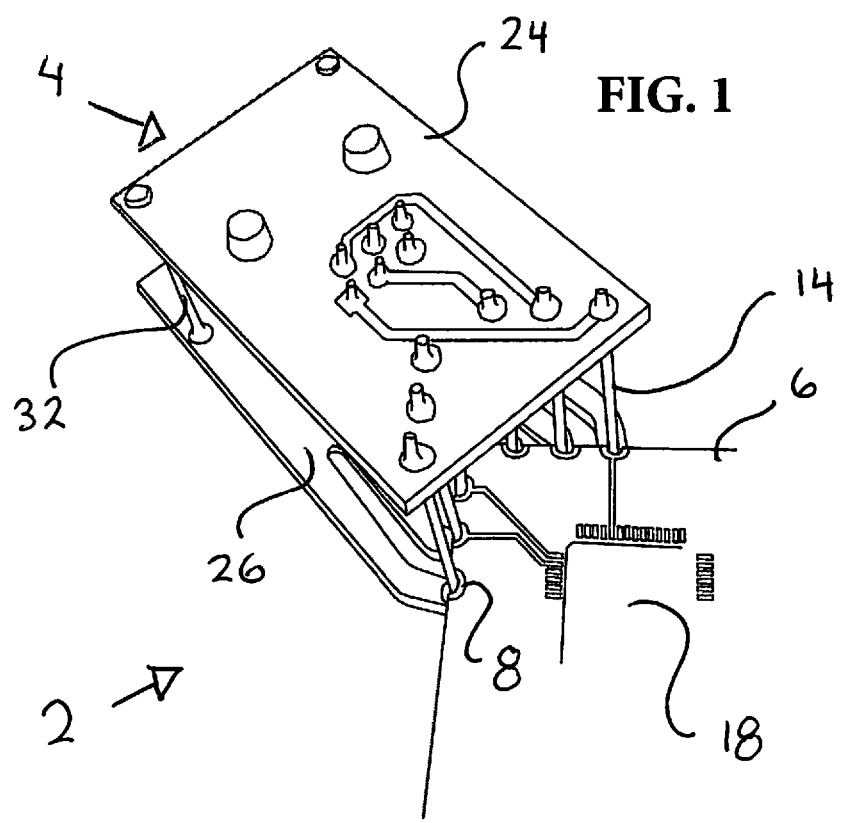
FIG. 1 is a top perspective of a PCB external device connector showing the mating engagement of a PCB adaptor connector and a PCB board connector.

Reference will now be made in detail to embodiments of the inventive concept, examples of which are illustrated in the accompanying drawings. The accompanying drawings are not necessarily drawn to scale. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, top and bottom, etc. may be used herein to describe various elements, these elements should not be limited by these terms. These terms are only used to distinguish one element from another. For example, a first attachment could be termed a second attachment, and, similarly, a second attachment could be termed a first attachment and a top element could be termed a second element without departing from the scope of the inventive concept.

It will be understood that when an element or layer is referred to as being "on," "coupled to," or "connected to" another element or layer, it can be directly on, directly coupled to or directly connected to the other element or layer, or intervening elements or layers may be present. In contrast, when an element is referred to as being "directly on," "directly coupled to," or "directly connected to" another element or layer, there are no intervening elements or layers present. Like numbers refer to like elements throughout.

The terminology used in the description of the inventive concept herein is for the purpose of describing particular embodiments only and is not intended to be limiting of the inventive concept. As used in the description of the inventive concept and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise indicated, all numbers herein used to express quantities, dimensions, and so forth, should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

As used herein, the term "board connector" refers to the half of the two part PCB connector that is incorporated/fabricated onto a target PCB.

As used herein, the term "adapter connector" refers to the half of the two part PCB connector that is incorporated/fabricated onto the external device or onto an adapter that acts as an interface between the external device and the PCB.

As used herein, the term "PCB external device connector" and "PCB connector" are synonyms for the same device, to wit: a two part connector to allow another device to electrically and physically couple to a PCB.

As used herein, the term" "target PCB" refers to a PCB to which an eternal device is to be connected using the PCB connector, and which has a board connector formed thereon.

As used herein, the term "etched wiring board (EWB)" refers to a phenolic, fiberglass or in general any other suitable insulating substrate plate that has wiring traces formed thereon. The adapter connector has a pair of such EWBs held in a parallel spaced configuration by at least a series of connector pins residing perpendicular to the two EWBs, and possibly any component (such as a pin connector for instance pin header or receptacle, or a socket connector) affixed thereon or between the EWBs that are needed to facilitate electrical connection with the external device to be connected to the PCB through the intervening PCB connector. These EWBs may also be called PCBs if there are any components mounted thereon besides the series of connector pins, however, this distinct EWB nomenclature is less confusing for the purposes of the description that follows.

As used herein, the term "castellated orifices" refers to cutouts in a PCB that are not totally enclosed or that have a contiguous interior side wall ("side"). When referred to as "approximately semi-circular" it means that the cutout on the edge of the PCB that forms a castellated orifice need not be precisely 180 radial degrees but rather, may be 180 degrees plus or minus 20 degrees.

The present invention relates to a novel design for a rugged, inexpensive, two part PCB external device connector for physically, electrically and removably joining an external device to a PCB for any of a plethora of testing, troubleshooting and programing purposes via a series approximately semi-circular orifices (called "castellated orifices") formed on a circular arc of a round or oval PCB or along two adjacent edges of the PCB at a corner or along and edge and a linear slot. It is important to note that the castellated orifices are "approximately" semi-circular indicating that a line drawn along the edge of the board where the board connector is formed may bisect or less than bisect the circular configuration of the castellated orifice, leaving half, less or more than half the truncated area of the orifice enclosed within the target PCB. They do not have to be equally spaced, but rather their spacing must just conform to that of the pins.

The novelty of this device resides in the way the PCB adapter connector portion locks to the PCB, by using moveable, non-linear slanted pins, and fixed castellated orifices, wherein one of the PCB adapter connector's two EWBs (where one end of each pin is attached), bends because the individual fingers formed (milled) on one of the PCB adapter connector's two boards to expand (or flex) slightly to retain the PCB, so as to frictionally engage the pins into the castellated orifices, thus using zero functional space on the PCB.

Figure 2:
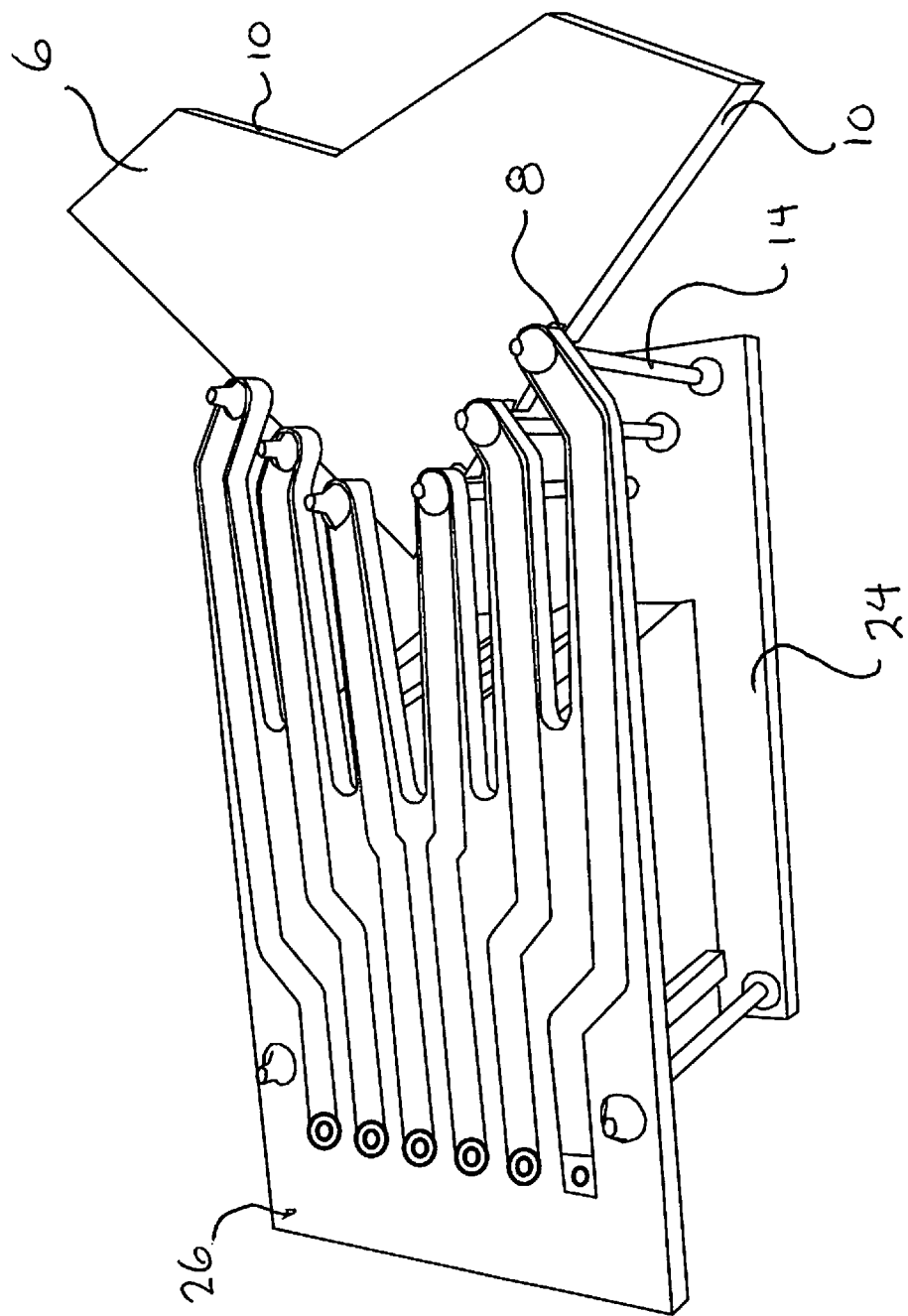
FIG. 2 is a is a bottom perspective view of the same PCB external device connector of FIG. 1.

FIGS. 1 and 2 illustrate a PCB external device connector 2 which is comprised of a PCB adapter connector 4 matingly engaged to a PCB board connector 8 (series of castellated orifices 8) for connection to a PCB 6. The PCB external device connector is made of two physically connectable halves (adapter connector 4 and board connector 8) joined by sliding frictional engagement.

The first half of the PCB external device connector 2 is termed the board connector 8 and it is a series of two linear formations of spaced cutouts 8 formed with their orifice midpoints typically lying along two adjacent edges 10 of the PCB 6, called castellated orifices. (See FIG. 3) In the illustrations herein, the two linear formations are shown at right angles to each other although this is just one embodiment. In other embodiments, the two linear formations forming the "90 degree V" may be at either obtuse or acute included angles, preferably between 20 and 160 degrees. In still other embodiments, there may be but one, non-linear formation (e.g. curved or circular with a series of equally spaced castellated orifices formed with their midpoints lying along an edge 10 of the PCB 6.) It is to be noted that herein, only rectangular PCBs are shown although it is well known in the industry the PCBs may be formed in a round or oval PCB configuration. In these configurations non "V" series of castellated orifices 8 will be used.

The castellated orifices 8 are preferably drilled or milled as circular orifices for subsequent conductive plating, but since the cord defining their truncated circular configuration lies along an edge 10 of the PCB 2, these orifices are approximately semi-circular shaped cutouts. Other geometrical configurations may also be employed that, in cross section, are partially circular, partially elliptical, partially square, partially triangular, or the like. The castellated orifices 8 may be semi-circular orifices or orifices slightly larger or smaller than semi-circular. (Hence the term "approximately semi-circular.)

The orifices 8 are plated on their sides 12 with a conductive metal, preferably gold, silver or copper or non-metal conductive plating such as carbon, graphite or the equivalent. Since these orifices 8 must slidingly, frictionally engage the locking pins 14 of the adaptor connector 4 and be able to make electrical contact thereafter, gold plating is preferable because of its excellent plating adhesion, resistance to corrosion and electrical properties.

Figure 3:
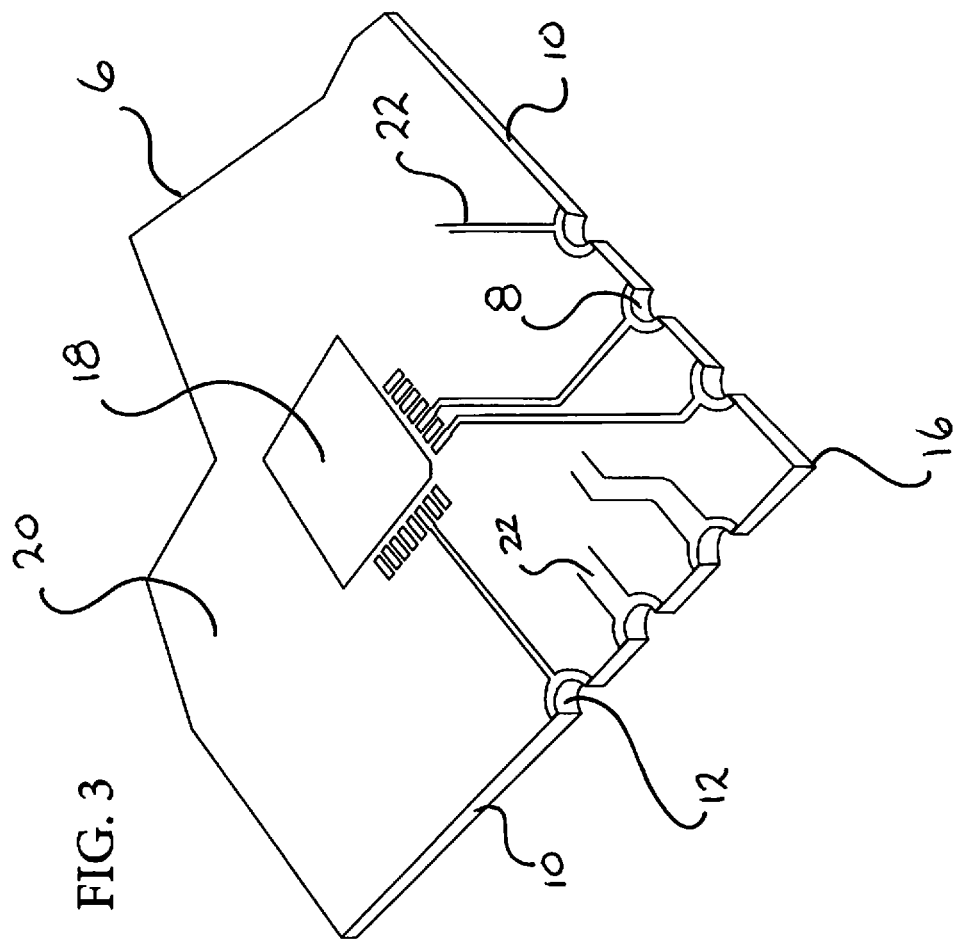
FIG. 3 is a top perspective view of a PCB with a board connector fabricated adjacent to a corner thereof.

It is to be noted that the two adjacent PCB edges 10 of FIGS. 1, 2 and 3 meet at the corner 16 of the PCB 6. This is not to indicate that the "V" must be located at a corner of the PCB 6. A linear slot may be cut into the PCB 6 that is perpendicular to any linear edge 10, (not illustrated) and one side of the slot 16 have equally spaced castellated orifices 8 formed there along so as to form the functionally same as the "V" of FIGS. 2, 3 and 4. This would also hold true for other configurations. Also, castellated orifices may be located along only one straight edge of a PCB al long as these castellated orifices are formed with more than 180 radial degrees.

The series of castellated orifices 8 have conductive traces 22 running along the face 20 of the PCB to an electric component 18 (I.E. microprocessor) mounted onto the PCB 6. (See FIG. 3.) These traces 22 are in electrical continuity with the conductive plated side walls 12 of the castellated orifices 8. Since the locking pins 14 are made of a conductive material and they are electrically connected to the conductive plated side walls 12 of the castellated orifices 8, they are also connected to the conductive traces 22 and the microprocessor 18, mounted on the PCB 6. Thus, electrical signals can travel from whatever is connected to the PCB adapter connector 2 and its conductive locking pins to the PCB board 8 connector, reaching the selected component 18 (i.e. a microprocessor) on the PCB 2. In this way, the two halves of the PCB external device connector 2 electrically connect external devices engaged with the PCB adapter connector 2 to components mounted on the PCB 6.

The second half of the PCB connector is termed the adapter connector 4 and is it made of a planar upper EWB 24 and a planar lower EWB 26 held in a parallel spaced configuration by a series of pins 14 and optionally additional standoffs 32. (See FIGS. 1, 2, 4 and 5.) The upper EWB 24 and lower EWB 26 are not identical and may be configured to house different components, microcontrollers or in general any circuit requiring diagnostics by external devices, or to incorporate other electrical socket or pin connectors that allow the connection to different components (not illustrated).

Spanning between the upper EWB 24 and lower EWB 26 is a series of two linear formations of spaced conductive pins 14. This linear formation must approximate the "V" formation of the board adaptor 8 to enable mating engagement so that electrical continuity between the orifice sides 12 and the pins 14 can be accomplished.

It is to be noted that one of the two planar EWBs 24 or 26 that form the body of the adapter connector 4 (illustrated as the lower EWB 26 here) is of a fingered design. There is one finger 28 for each of the conductive pins 14 in the series, each having a connective orifice near its end 30 that one (proximal) end of each of each of the pins 14 is connected to. These fingers 28 can flex slightly to accommodate the slight movement of the pins 14 as they spread momentarily to frictionally engage the series of castellated orifices 8 when the adapter connector 4 is engaging the board connector 8. The other (distal) end of the conductive pins 14 is connected to another connective orifice of the series of conductive orifices formed through the other (upper) EWB. The shape of the series of these conductive orifices in the EWBs may be in a "V" or another shape as discussed herein.

While the pins 14 hold the upper EWB 26 and lower EWB 24 parallel, they are not perpendicular to the planes of the upper EWB 26 and lower EWB 24. It is also important to note that the pins 14 as illustrated in the embodiments herein, are equally spaced at their top (proximal) ends and equally spaced at their bottom (distal) ends, but the spacing at their top ends and bottom ends are not identical. (Compare FIGS. 4 and 5.) It is important to note that while equal spacing is the most convenient, it is not a functional requirement. The spacing can be arbitrary as long as it is not equal on the top and bottom and the wedging concept for locking the two portions together is maintained. Of course, the spacing between the castellated orifices must matingly engage the spacing of the pins.

Figure 5:
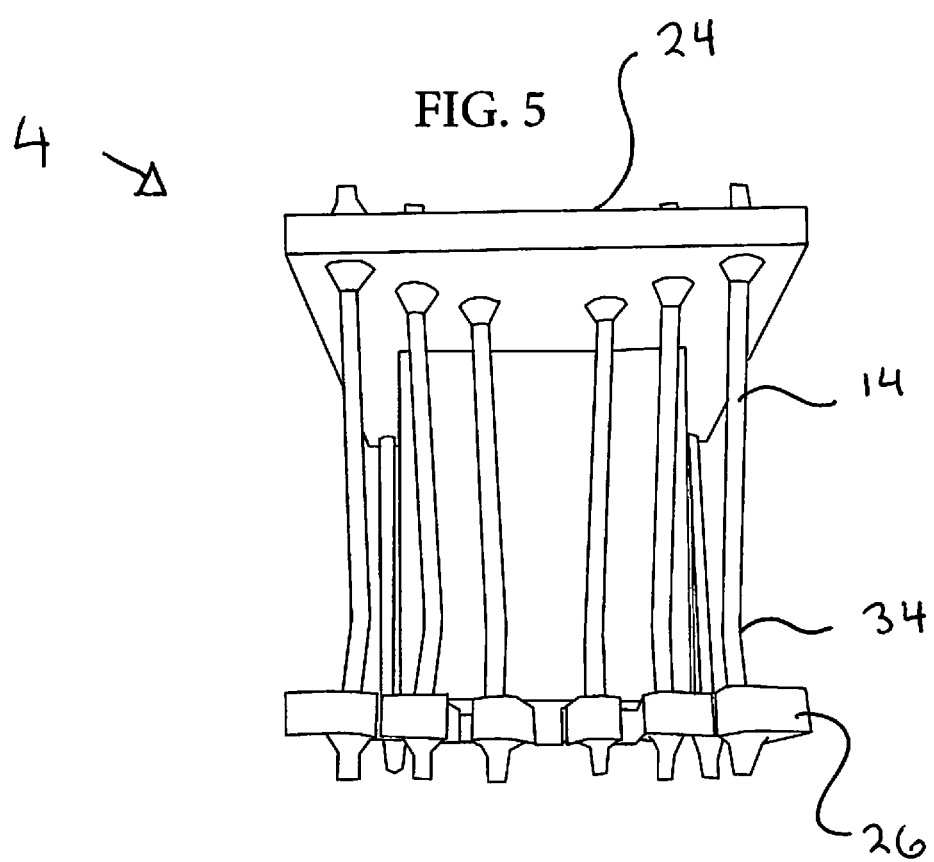
FIG. 5 is a front view of a PCB adapter connector.
Figure 6:
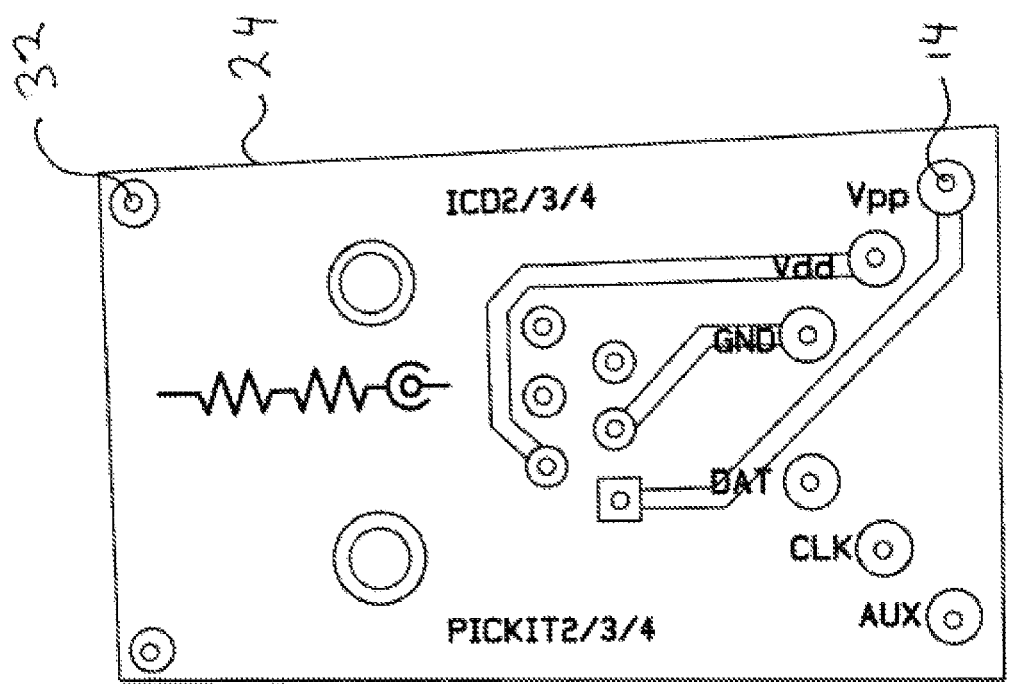
FIG. 6 is a bottom view of the bottom (second) EWB of the PCB adaptor connector.
Figure 7:
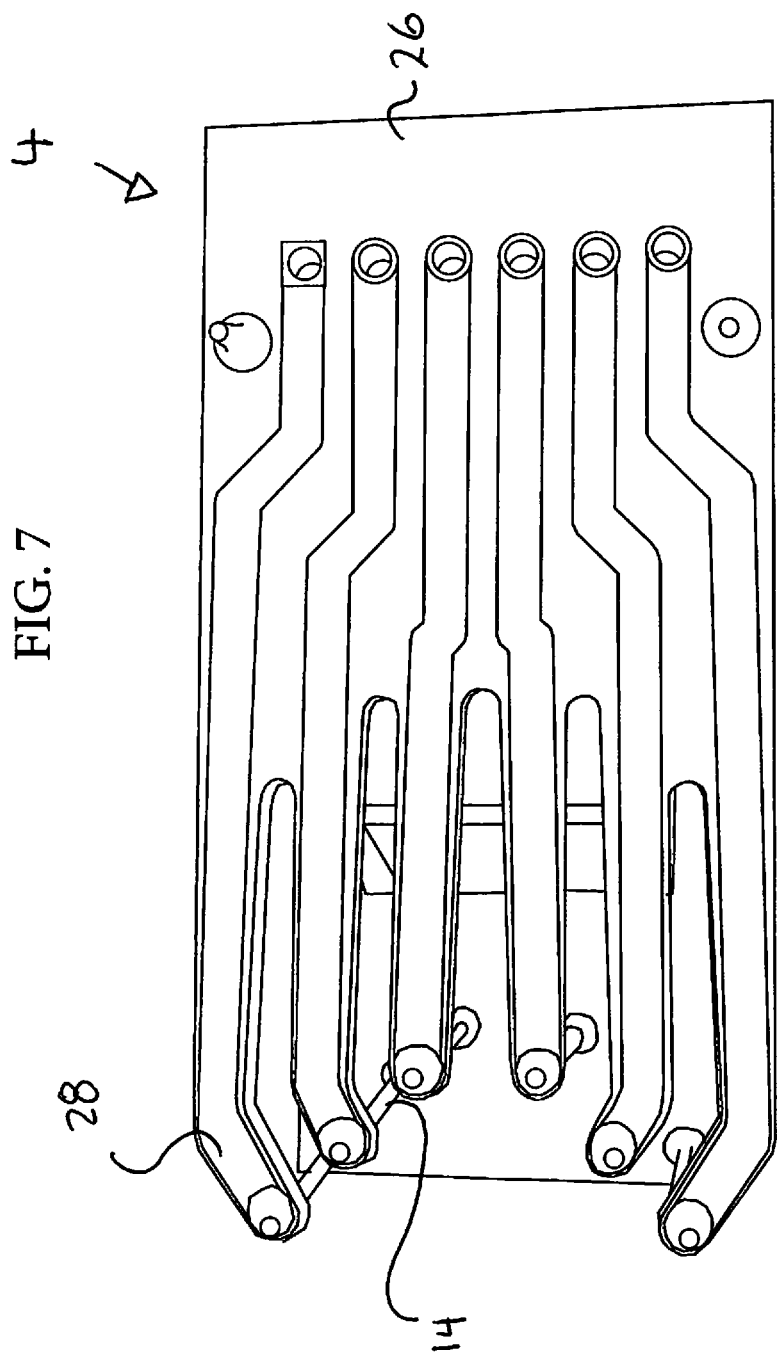
FIG. 7 is a top view of the top (first) EWB of the PCB adaptor connector showing its flexible fingers.

The bottom end spacing of the pins 14 is slightly smaller than the top end spacing as can best be seen in FIG. 5. The diameter of the pins 14 is smaller than the diameter of the castellated orifices 8 in the PCB 6 to allow full engagement of the series of castellated orifices 8 around the top end of the pins 14. The spacing of the pins 12 at their top end matches the spacing of the orifices 8. The castellated orifices 8 thus match up with the pins 14 and can easily mount onto the pins top end at the top EWB 26 and then be coaxed slidingly down the pins 14 toward the lower EWB 24 in assembly.

Figure 4:
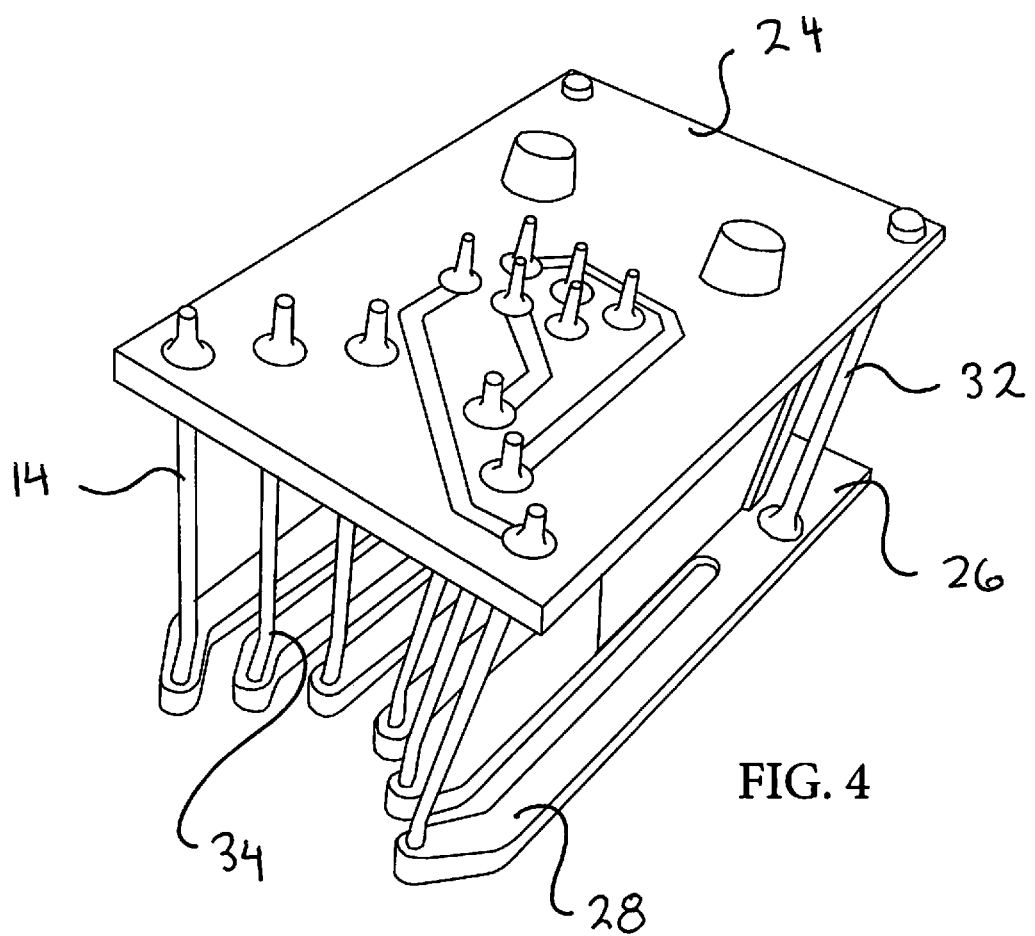
FIG. 4 is a perspective side view of a PCB adapter connector.

Looking at FIGS. 4 and 5 it is clear that the pins 14, aside from tapering closer together from top to bottom, are not linear pins 14. Rather, each of the pins 14 has a slight bend 34 that forms an obtuse angle at its bottom end. This angle serves to provide an audible "click", and PCB locking and retention when the two halves of the connector 2 are properly engaged and electrical continuity between the two is made. It is important to note that springing action maintaining side pressure to the bottoms of pins 14 is provided by the flexibility of the PCB material which is shaped into the fingers 28 (to which each pin 14 is attached to) for this specific purpose. Without the bend 34 the PCB will not be locked in place and could make its way up the pins toward the top EWB and disengage during handling while working with external devices.

In operation, the "V" formation of the series of castellated orifices on the PCB 6 is fit into the corresponding "V" formation at the top end of the pins 14, closest the upper EWB 26. At this point, since the castellated orifices 8 have a circular diameter larger that of the pins 12, (preferably by 100% of the diameter of the pins 14) the sides 12 of the castellated orifices 8 freely contact the pins 14. The contact point in each of the castellated orifices 8 is at the approximate midpoint of its semi-circular configuration. As the board connector 8 is held parallel with the two EWBs 24 and 26 it is slid downward along the shafts of the pins 14. Since the pins 14 taper inward toward the bottom EWB 24, the fingers 28 of the top EWB 26 flex and spread slightly so that the bottom end of the pins 14 shift their position within each of the castellated orifices 8 so as to reside and exert sideward pressure more towards the front of the castellated orifice 8, forcing the board connector "V" configuration tighter into the adaptor connector pins "V" configuration. The pressure on the castellated orifices 8 along two adjacent edges 10 of the PCB 6 grab the PCB 6 and pull it tighter into the adapter connector 4 until the board connector 8 reaches the bend 34 near the bottom of the pins 14. As this occurs, the fingers 28 of the adapter connector 4 flex slightly apart to accommodate this pressure. From this point on, the pin spacing increases slightly such that the board connector 8 slides to the bottom of the pin 14 where it is still held firmly to the adapter connecter but requires upward force (in a twisting motion) to disengage the two connector halves. When the board connector 8 passes the bend 34 less downward sliding force is required to move the PCB 6 and there is an audible "click", and a slight shock is felt on the PCB 6, signaling that the two halves are successfully mated.

The novelty this device lies in the principle of retaining a mating part to castellated orifices and accordingly—in the design of the adapter's mating connector using slanted, non-linear pins and the springy fingers that are soldered to self-wedge and self-lock. No other retaining elements are needed, and there is no need to exert a side pressure against the PCB before the two halves of the connector are mated.

While certain features and aspects have been described with respect to exemplary embodiments, one skilled in the art will recognize that numerous modifications are possible. Moreover, while the procedures of the methods and processes for building, assembling and using the devices described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with—or without—certain features for ease of description and to illustrate exemplary aspects of those embodiments, the various components and/or features described herein with respect to a particular embodiment can be substituted, added, and/or subtracted from among other described embodiments, unless the context dictates otherwise.

Consequently, in view of the wide variety of permutations to the embodiments described herein, this detailed description and accompanying material is intended to be illustrative only, and should not be taken as limiting the scope of the inventive concept. What is claimed as the invention, therefore, is all such modifications as may come within the scope and spirit of the following claims and equivalents thereto.

Having thus described the invention, what is claimed as new and desired to be secured by Letters Patent is as follows:

1. A printed circuit board (PCB) external device connector comprising:
    a PCB board connector portion, made of a series of castellated orifices formed adjacent to a corner of two PCB board edges that intersect to form said corner on a PCB, said castellated orifices having sides that are plated with a conductive metal, and connected to conductive traces formed on said PCB;
    a PCB adapter connector portion consisting of:
    a first planar, etched wiring board and a second planar, etched wiring board held in a parallel spaced configuration from said first planar, etched wiring board by said series of non-linear, non-parallel, electrically conductive pins matingly engageable with said series of castellated orifices; wherein
    said first planar, etched wiring board has a first series of penetrations formed therethrough in a first pattern and said second planar, etched wiring board has a second series of penetrations formed therethrough in a second pattern smaller than said first pattern; and
    wherein said first planar, etched wiring board has a series of flexible fingers, each with one of a penetration formed thereon from said first series of penetrations.

2. A printed circuit board (PCB) external device connector comprising:
    a PCB board connector portion, made of a series of castellated orifices formed on at least one PCB board edge on a PCB, said castellated orifices having sides that are plated with a conductive metal, and connected to conductive traces formed on said PCB;
    a PCB adapter connector portion made of a first planar, etched wiring board and
    a second planar, etched wiring board held in a parallel spaced configuration from said first planar, etched wiring board by a series of pins, wherein
    said series of pins are non-linear, non-parallel, electrically conductive pins that are matingly engageable with said series of castellated orifices, and
    wherein said first planar, etched wiring board has a first series of penetrations formed therethrough in a first pattern; and
    wherein said second planar, etched wiring board has a second series of penetrations formed therethrough in a second pattern; and
    wherein said series of pins extend between said first series of penetrations and said second series of penetrations; and
    wherein said first planar, etched wiring board has a series of flexible fingers, each with one of a penetration formed thereon from said first series of penetrations.

\* \* \* \* \*